US007868423B2

(12) United States Patent
Benoit et al.

(10) Patent No.: US 7,868,423 B2
(45) Date of Patent: Jan. 11, 2011

(54) OPTIMIZED DEVICE ISOLATION

(75) Inventors: John J. Benoit, Williston, VT (US); David S. Collins, Williston, VT (US); Natalie B. Feilchenfeld, Jericho, VT (US); Michael L. Gautsch, Jericho, VT (US); Xuefeng Liu, South Burlington, VT (US); Robert M. Rassel, Colchester, VT (US); Stephen A. St. Onge, Colchester, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/269,073

(22) Filed: Nov. 12, 2008

(65) Prior Publication Data

US 2010/0117122 A1    May 13, 2010

(51) Int. Cl.
*H01L 21/02* (2006.01)
(52) U.S. Cl. .............................. 257/548; 257/E27.067; 257/E29.019
(58) Field of Classification Search ................. 257/548, 257/E29.019, E27.067
See application file for complete search history.

(56) References Cited

U.S. PATENT DOCUMENTS

| | | | |
|---|---|---|---|
| 6,097,068 A | | 8/2000 | Brown et al. |
| 6,288,424 B1 * | | 9/2001 | Ludikhuize ................. 257/335 |
| 6,387,744 B2 | | 5/2002 | Taniguchi et al. |
| 6,396,109 B1 * | | 5/2002 | Hutter et al. ................ 257/372 |
| 6,627,937 B2 * | | 9/2003 | Shinkawata ................. 257/296 |
| 6,969,901 B1 * | | 11/2005 | Pan et al. .................... 257/500 |
| 7,161,213 B2 | | 1/2007 | Ito et al. |
| 7,462,530 B2 * | | 12/2008 | Rittaku ....................... 438/208 |
| 2006/0102961 A1 * | | 5/2006 | Ohkubo et al. ............. 257/371 |
| 2006/0133189 A1 * | | 6/2006 | Sung et al. ................ 365/238.5 |
| 2007/0170515 A1 | | 7/2007 | Collins et al. |

OTHER PUBLICATIONS

Izahan Syemylona Ishak et al., RF Substrate Noise Characterization for CMO 0.18 μm; 2004 RF and Microwave Conference, Oct. 5-6, 2004, Subang, Selangor, Malaysia, 2004 Copyright IEEE.

* cited by examiner

*Primary Examiner*—Sue Purvis
*Assistant Examiner*—Benjamin P Sandvik
(74) *Attorney, Agent, or Firm*—Cantor Colburn LLP; Richard Kotulak

(57) ABSTRACT

A structure for a semiconductor device includes an isolated MOSFET (e.g., NFET) having triple-well technology adjacent to an isolated PFET which itself is adjacent to an isolated NFET. The structure includes a substrate in which is formed a deep n-band region underneath any n-wells, p-wells and p-band regions within the substrate. One p-band region is formed above the deep n-band region and underneath the isolated p-well for the isolated MOSFET, while another p-band region is formed above the deep n-band region and underneath all of the p-wells and n-wells, including those that are part of the isolated PFET and NFET devices within the substrate. The n-wells for the isolated MOSFET are connected to the deep n-band region. The resulting structure provides for improved device isolation and reduction of noise propagating from the substrate to the FETs while maintaining the standard CMOS spacing layout spacing rules and electrical biasing characteristics both external and internal to the triple-well isolation regions.

19 Claims, 7 Drawing Sheets

US 7,868,423 B2

OPTIMIZED DEVICE ISOLATION

BACKGROUND

The present invention relates generally to semiconductor device design and, more particularly, to a structure for optimized isolation of devices formed within a semiconductor integrated circuit ("IC").

In advanced complementary metal oxide semiconductor ("CMOS") technology, noise isolation and the elimination of latch-up are becoming increasingly important. More particularly, as MOS field effect transistor ("MOSFET") threshold voltages decrease, the need to isolate circuitry from RF noise sources has become more important. This has led to an increased use of "isolated" MOSFETS or "triple-well technology" MOSFETS.

BRIEF SUMMARY

According to an embodiment of the invention, a structure includes a substrate doped to have a certain type of conductivity. The structure also includes a first implant region disposed at least partially next to the substrate, wherein the first implant region is doped to have a type of conductivity opposite to that of the substrate, and at least one second implant region disposed at least one of within the first implant region and adjacent to the first implant region, wherein the at least one second implant region is doped to have a type of conductivity opposite to that of the first implant region. The structure further includes an isolated well region disposed next to the at least one of the at least one second implant region, wherein the isolated well region is doped to have the same conductivity as that of the at least one second implant region. The structure also includes a pair of well regions disposed on either side of the isolated well region, wherein the pair of well regions are doped to have the same type of conductivity as that of the first implant region, wherein the pair of well regions electrically contact the first implant region, and wherein the isolated well region is not in electrical contact with the first implant region and is isolated therefrom and is isolated from the substrate.

According to another embodiment of the invention, a structure includes a substrate doped to have a certain type of conductivity. The structure also includes a first implant region disposed at least partially next to the substrate, wherein the first implant region is doped to have a type of conductivity opposite to that of the substrate, and at least one second implant region disposed at least one of within the first implant region and adjacent to the first implant region, wherein the at least one second implant region is doped to have a type of conductivity opposite to that of the first implant region. The structure further includes an isolated well region disposed next to the at least one of the at least one second implant region, wherein the isolated well region is doped to have the same conductivity as that of the at least one second implant region. The structure also includes a pair of well regions disposed on either side of the isolated well region, wherein the pair of well regions are doped to have the same type of conductivity as that of the first implant region, wherein the isolated well region has a built-in potential difference with respect to the first implant region and is isolated therefrom, wherein one of the pair of well regions is similarly disposed next to at least one of the at least one second implant region, and wherein another one of the pair of well regions electrically contacts the first implant region.

According to yet another embodiment of the invention, a structure includes a p− doped substrate, a first implant region disposed within the substrate, wherein the first implant region is doped n−, and a plurality of second implant regions disposed at least one of within the first implant region and adjacent to the first implant region, wherein the second implant regions are doped p−. The structure also includes an isolated p well region disposed next to one of the plurality of second implant regions. The structure further includes a pair of n well regions disposed on either side of the isolated p well region, wherein the pair of well regions electrically contact the first implant region, and wherein the isolated p well region is not in electrical contact with the first implant region and is isolated therefrom.

According to still another embodiment of the invention, a structure includes a p− doped substrate. The structure further includes a first implant region disposed within the substrate, where the first implant region is doped n−, and a plurality of second implant regions disposed at least one of within the first implant region and adjacent to the first implant region, wherein the plurality of second implant regions are doped p−. The structure also includes an isolated p well region disposed next to one of the plurality of second implant regions. The structure still further includes a pair of n well regions disposed on either side of the isolated p well region, wherein the isolated p well region is not in electrical contact with the first implant region and is isolated therefrom, wherein one of the pair of n well regions is disposed next to one of the second implant regions and is not in electrical contact with the first implant region and is isolated therefrom, and wherein another one of the pair of n well regions electrically contacts the first implant region.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
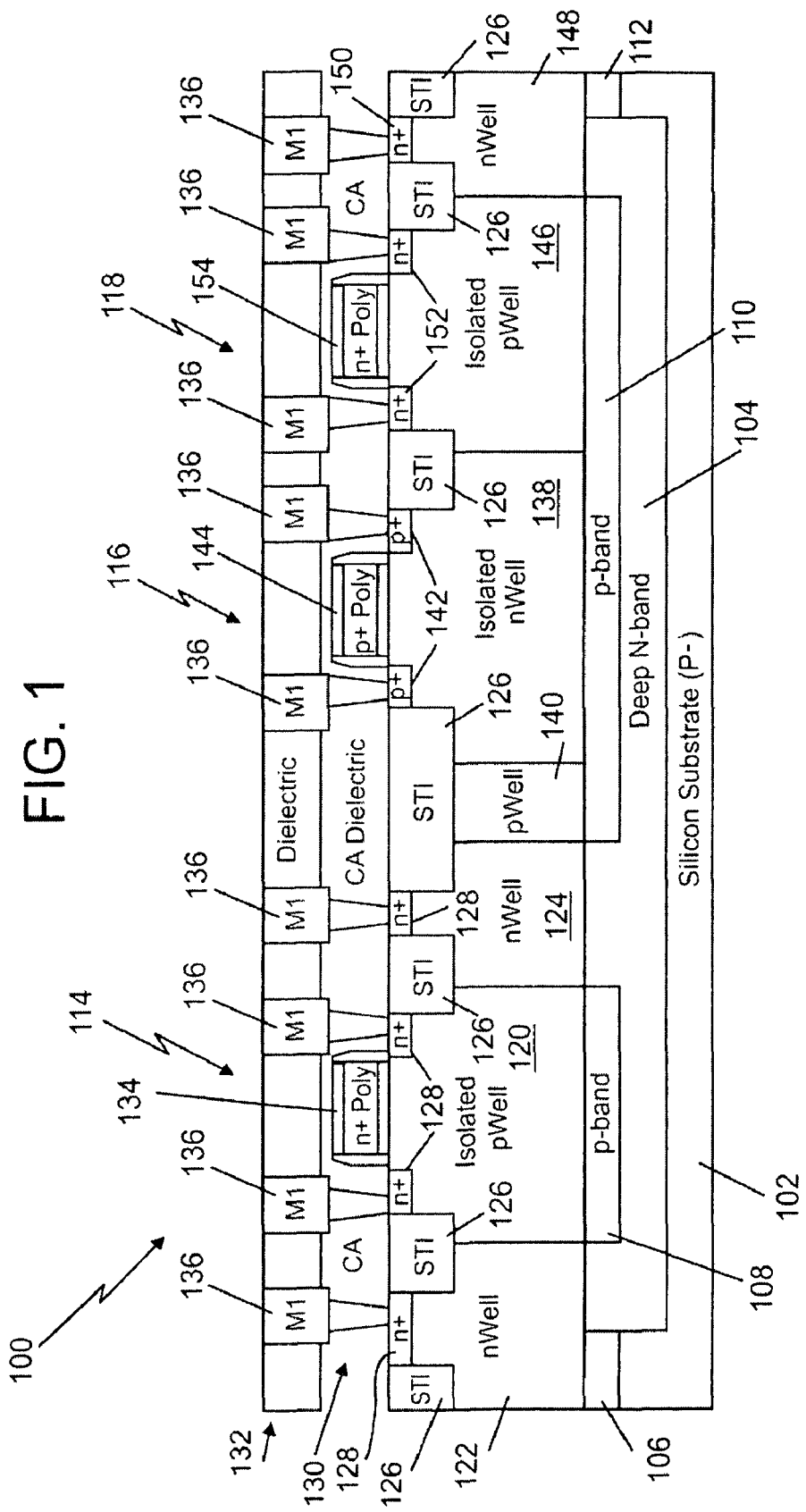
FIG. 1 is a cross-section of an embodiment of the invention relating to a structure of a semiconductor device.

Referring to FIG. 1, there illustrated in cross-section is an embodiment of the invention that includes a structure 100 to achieve optimized device isolation. The structure 100 may comprise, for example, one or more CMOS semiconductor devices that may be a part of a much larger integrated circuit ("IC"). An embodiment of a method for forming the structure 100 of an embodiment of the invention is described in detail hereinafter. The structure includes a substrate 102, which may be doped p−. Located next to (i.e., above) the p−substrate 102 is a deep n-band implant region 104. Next are a number of p-band implant regions 106-112. On the left-hand side of FIG. 1 is an isolated MOSFET 114 (e.g., an NFET) formed within the substrate 102 using triple-well technology, as described in detail herein. To the right of the MOSFET 114 is an isolated PFET 116 formed within the substrate 102, and to the right of the isolated PFET 116 is an isolated NFET 118 also formed within the substrate 102, where both the isolated PFET 116 and the isolated NFET 118 use triple-well technology, as described in detail herein.

The triple-well technology isolated MOSFET 114 includes a p-well 120 that includes (i.e., is next to or disposed over) a p-band region 108 and is isolated from the substrate 102 (and, thus, from potential noise sources within the substrate 102) by the deep n-band region 104. On each side of this p-well 120 is an n-well 122-124, where the n-wells 122-124 electrically connect to each other (FIG. 3) and to the deep n-band region 104. The p-band region 106 may be located underneath only a portion of the perimeter n-well 122. Thus, the "triple-well technology" refers to the isolated p-well 120 and the p-band region 108 located in between the two n-wells 122-124 and within the deep n-band region 104.

A plurality of conventional shallow trench isolation ("STI") regions 126 is formed in the substrate 102. The isolated MOSFET 114 also includes a number of n+ contact regions 128, where two of the regions 128 within the isolated p-well 120 comprise the drain and source terminals of the isolated MOSFET 114. Two dielectric layers 130-132 are formed on top of the substrate 102. Within the (CA) dielectric layer 130 closest to the top surface of the substrate 102 is formed the gate terminal 134 of the isolated MOSFET 114. A number of conventional metal one ("M1") connections 136 are provided down through the two dielectric layers 130-132 to facilitate electrical contact to the n+ regions 128 of the isolated MOSFET 114 from outside the structure 100 or to other parts of the semiconductor device. Thus, it can be seen from the foregoing that the MOSFET 114 is isolated from noise in the substrate 102 by the deep n-band region 104 which is directly underneath the entirety of the isolated p-well 120 and the p-band region 108.

Still referring to FIG. 1, the isolated PFET 116 includes an isolated n-well 138 that may be located entirely above the p-band region 110. To the left of the isolated n-well 138 is an isolated p-well 140 that electrically connects to the p-band region 110. A pair of p+ contacts 142 formed in the isolated n-well 138 comprise the drain and source terminals of the isolated PFET 116. A gate terminal 144 for the isolated PFET 116 is formed in the first dielectric layer 130. An M1 contact 136 is provided for each of the drain and source terminals 142 of the isolated PFET 116.

Disposed to the right of the isolated PFET 116 in FIG. 1 and adjacent thereto is an isolated NFET 118. The isolated NFET 118 includes an isolated p-well 146, to the right of which is located an n-well 148 that electrically connects to the deep n-band region 104. The p-band region 112 may be located underneath only a portion of the perimeter n-well 148. The isolated p-well 146 connects to the isolated p-well 140 through the p-band region 110, which results in the isolated p-wells 140, 146 forming a contiguous region 188 (FIGS. 2-3) enclosing the isolated n-well 138 on all sides. The n-well 148 has an n+ contact 150. A pair of n+ contacts 152 formed in the isolated p-well 146 comprise the drain and source terminals of the isolated NFET 118. A gate terminal 154 for the isolated NFET 118 is formed in the first dielectric layer 130. An M1 contact 136 is provided for each of the drain and source terminals 152 of the isolated NFET 118.

Figure 2:
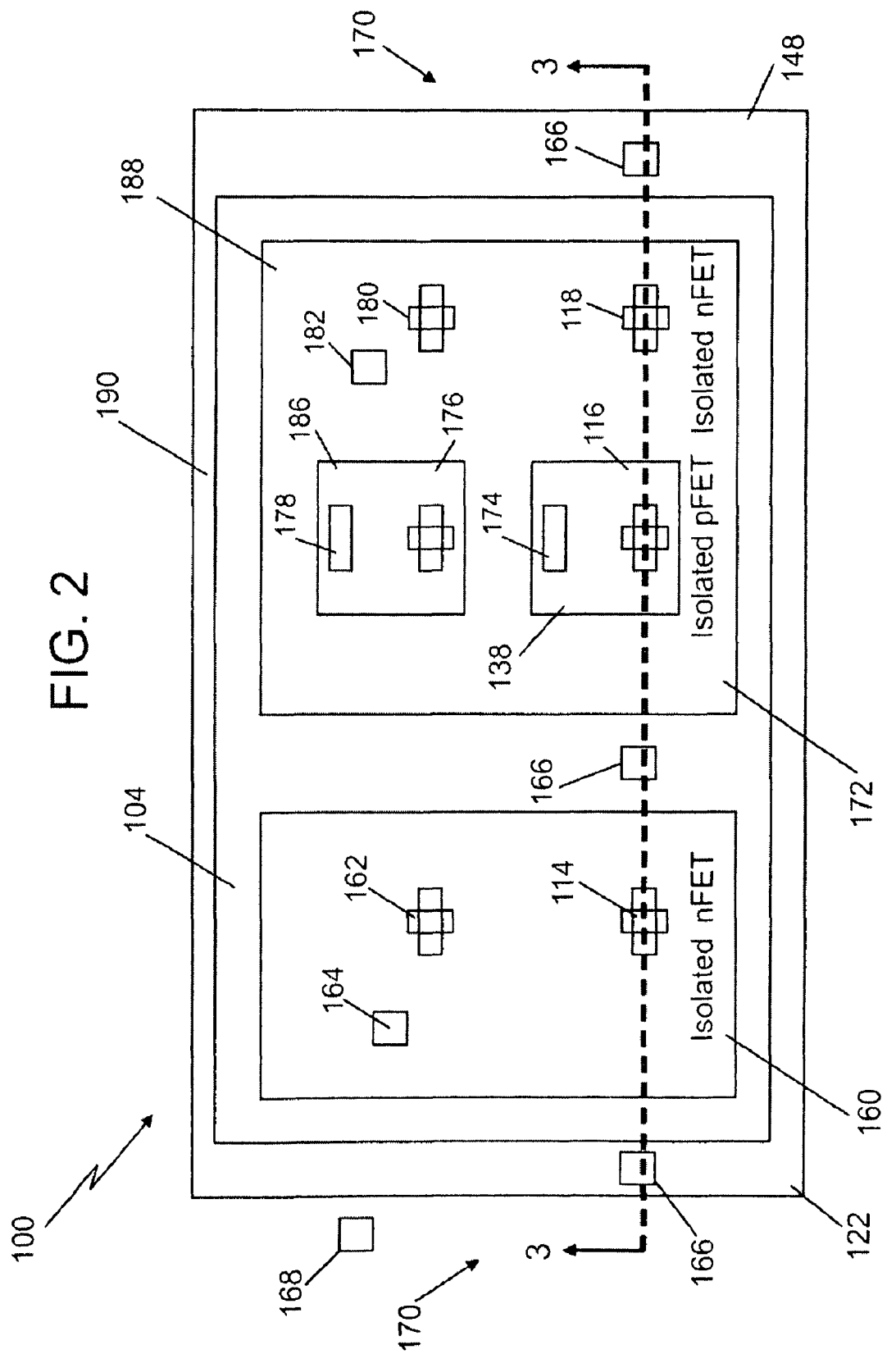
FIG. 2 is a top view of the embodiment of FIG. 1.

Referring also to FIG. 2, there illustrated is a top view of an embodiment of the structure 100 of FIG. 1 that further illustrates the device isolation that is achieved through use of the deep n-band region 104 and the various p-band regions 106-112. Shown is a region 160 that includes the isolated p-well 120 of the isolated MOSFET 114, beneath which is the p-band region 108 (FIG. 1) and a portion of the deep n-band region 104 (FIG. 1). Included within that region 160 is a second isolated MOSFET (NFET) 162 that may be structured similarly to the isolated MOSFET 114 shown in FIG. 1. The second isolated MOSFET (NFET) 162 is optional, or there may be a greater multiplicity of isolated MOSFETs (NFETs) 162 within the region 160 structured similarly to the isolated MOSFET 114 shown in FIG. 1. A contact 164 to an isolated p-well is also shown. Surrounding the isolated MOSFET region 160 is the deep n-band region 104. Also shown are the surrounding n-wells 122, 124, 148, which are shown to be a contiguous region 190 in FIG. 2. Isolation contacts 166 within the n-well region 190 are provided to the deep n-band region 104. A multiplicity of isolated contacts 166 are shown in reference to FIG. 1, although only a minimum of one contact, or one contiguous contact, is necessary to form an electrical connection of the n-wells 122, 124, 128 to the deep n-band region 104. A contact 168 to the p−substrate 102 is also provided, where this contact lies within an outlying p-well/p-band region 170.

FIG. 2 also illustrates a second region 172 that contains the isolated PFET 116 and the isolated NFET 118 of FIG. 1. The isolated PFET 116 includes a contact 174 to the isolated n-well 138. A second isolated PFET 176 is shown, which may be similar to the first isolated PFET 116 and which includes a contact 178 to an isolated n-well that is used for this isolated PFET 176. The region 172 also includes the isolated NFET 118 of FIG. 1. A second isolated NFET 180 is also shown, which may be similar to the isolated NFET 118. An isolated p-well contact 182 to an isolated p-well 172 is provided. The second isolated NFET 180 or isolated PFET 176 are optional, or there may be a greater multiplicity of either the isolated NFET 118 or the isolated PFET 116 within the region 172 and structured similarly to the isolated NFET 118 or the isolated PFET 116 as shown in FIG. 1. Each additional isolated PFET 176, 116 includes a contact 178, 174 to a corresponding isolated n-well that is used for each of these additional isolated PFETs.

Figure 3:
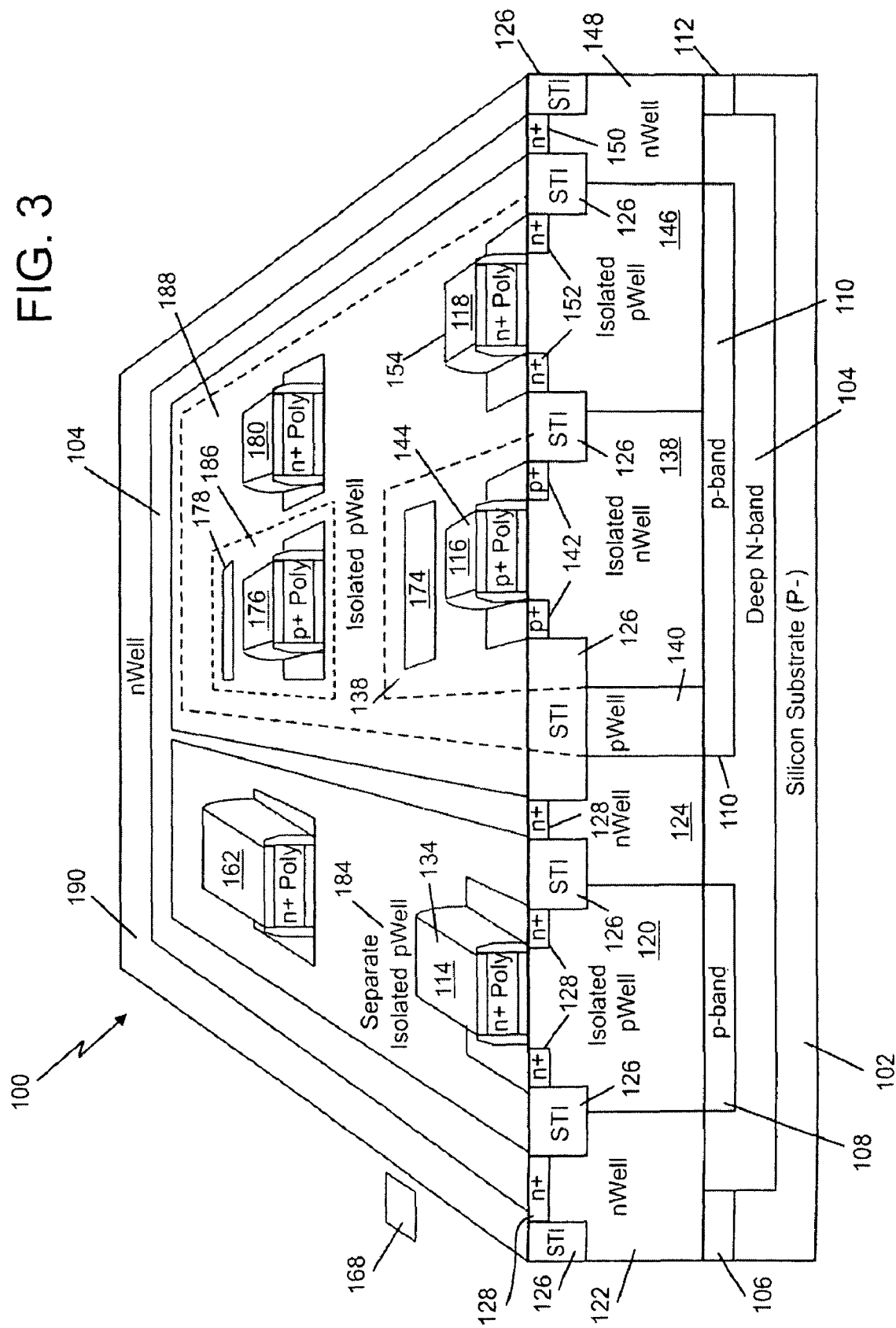
FIG. 3 is a three-dimensional view, taken along the lines 3-3 in FIG. 2, which illustrates in more detail the embodiment of FIGS. 1-2.

Referring to FIG. 3, there illustrated is a three-dimensional view of the embodiment of the structure 100 of FIGS. 1-2 of the invention taken along the lines 3-3 in FIG. 2. The dielectric layers 130-132 and the M1 contacts 136 of FIG. 1 are not shown in FIG. 3 for clarity. FIG. 3 shows a separate isolated p-well 184 in between and surrounding the two isolated MOSFETS 114, 162. Also illustrated is the isolated n-well 138 of the isolated PFET 116 and a second isolated n-well 186 of the second isolated PFET 176. The two isolated n-wells 138, 186 are surrounded by the common, isolated p-well 188. Also, the three n-wells 122, 124, 148 of FIG. 1 are shown in FIG. 3 as forming the common n-well region 190.

In the embodiment of the invention of the structure 100 of FIGS. 1-3, the voltage potential of the isolated n-well 138 and that of the isolated n-well 186 may be different or may be electrically biased the same. The n-wells 138 and 186 both have a common p-band region 110 shared with the isolated p-wells 140, 146 which together are also defined as the isolated p-well 188. Further, the isolated n-well 138 and the isolated n-well 186 are electrically isolated from noise sources in the p−silicon substrate 102, as a result of the p-band region 110 and the deep n-band region 104. The common isolated p-well region 188 completely borders or surrounds the isolated n-well 138 and the isolated n-well 186. This isolated p-well region 188 is completely enclosed by the common n-well region 190, where portions of the n-well region 190 are not located over the p-band regions 106-112. The common n-well region 190, below the Shallow Trench Isolation (STI) 126, is at same electrical potential and can differ from the electrical potential of the isolated p-well 120, since the n-wells 122, 124, 148 are electrically connected to the deep n-band region 104 and thus isolate the different p-wells 120, 140, 146, also defined as the isolated p-well regions 184, 188, respectively, even though these isolated p-wells are within the common deep n-band region 104. In addition, the isolated p-well 140, 146 each have the p-band region 110 underneath, shared with the isolated n-wells 138, 186. Further, the n-wells 122, 124, 148 and the deep n-band region 104 form a sidewall border and electrical connection for substrate noise isolation. The common n-well region 190 is at the same electrical potential around the perimeter and in between the isolated p-wells 120, 140, 146, which enclose the isolated n-wells 138, 186. However, the electrical bias of the n-wells 122, 124, 148 can be independent of the electrical bias for the isolated n-wells 138, 186 as a result of the p-band region 110.

In an embodiment of a method for forming the embodiment of the structure 100 of the invention illustrated in FIGS. 1-3, the p– silicon substrate 102 is provided. A plurality of the shallow trench isolation ("STI") regions 126 is formed near the top surface of the substrate 102. These regions 126 may be formed in a conventional manners using mask, etch, fill and planarize steps. The deep n-band region 104 is formed using, e.g., ion implantation. The ion implantation step comprises the typical steps of mask, strip, and clean for ion implant in the desired regions of the substrate 102. A number of mask or block regions are provided for ion implantation of the p-band regions 106-112. The mask (e.g., photoresist) regions may be formed on the top surface of the substrate 102. The ion implantation of the p-band regions 106-112 comprises an ion implant in desired regions within the substrate 102, which are those regions not blocked off by the photoresist masks, resulting in the p-band implants 106-112 in certain regions within the substrate 102. The mask regions on the top surface of the substrate 102 may be removed and the substrate surface may be cleaned.

The embodiment of the method includes the formation of a number of the n-wells 122, 124, 138, 148 in the substrate 102. This step comprises the steps of mask, strip, and clean for ion implant in the desired regions of the substrate 102. The n-wells 122-124 for the isolated MOSFET 114 (i.e., "triple well technology") are located in the substrate 102 in regions where the p-band regions 106-112 are not present either partially or entirely. As such, these n-wells 122-124 are electrically connected ("shorted") to the deep N-band region 104. These n-wells 122-124 may be biased at a voltage potential that benefits noise isolation of the other n-well(s) or the p-well (s) that are part of the isolated FETS 116-118, which are fully isolated by either the p-band region 110 or the deep n-band region 104 from noise sources present in the p– silicon substrate 102. The isolated n-well 138 that is part of the isolated PFET 116 is located fully above the p-band region 110 and is electrically isolated from the deep N-band region 104 by the p-band region 110. This isolated n-well 138 is electrically isolated from the p– substrate 102 and other n-wells 122, 124, 148 outside of the deep n-band region 104. This n-well 138 has a built-in potential difference with respect to the isolated p-wells 140, 146, where these isolated p-wells enclose this isolated n-well 138.

A number of the p-wells are formed in the substrate 102. Similar to the n-well formation step described above, this comprises the steps of mask, strip, and clean for ion implant in the desired regions of the substrate 102. The p-well 120 that is part of the isolated MOSFET 114 may have the p-band region 108 located directly underneath which may electrically connect the p-well 120 at a common voltage potential to the p-band region 108. This p-well 120 is electrically isolated by the both the n-wells 122-124 and the deep N-band region 104 from noise sources in the p-silicon substrate 102 or other p-well(s) 140, 146 located within the common deep n-band region 104. The p-well 146 that is part of the isolated NFET 118 is located fully above the p-band region 110 and the p-band region 110 has a built in potential difference from the deep n-band region 104. This p-well 146 is electrically isolated from the p–substrate 102 by the deep n-band region 104. This isolated p-well 146 may be electrically connected at a common voltage potential to the p-well 140 as it forms an annulus surrounding the isolated n-well 138 and is also electrically connected by the p-band region 110 located commonly underneath both p-wells 140, 146. As stated, the p-well 146 has a built-in potential difference from the p–substrate 102 by the deep n-band region 104, and by similarity the p-well 140 is also isolated from the p-substrate 102. These p-wells 140, 146 are electrically isolated from the other isolated p-well 120 within the common deep n-band region 104 by the built-in potential differences from the n-well 124 and the deep n-band region 104 to these p-wells 140, 146 and 120. All of the p-wells 120, 140, 146 located fully above the p-band regions 108-110 with the common deep n-band region 104 below may be at the same electrical potential. However, these p-wells 120, 140, 146 may be at voltage potentials different than the p–substrate 102 and any other p-well(s) located outside the deep n-band region 104. The p-wells 140, 146, which are at common electrical potential by layout construction of this embodiment, may be at voltage potentials different than the p-well 120 as a result of the discontinuity between the p-band regions 108, 110.

The transistor gate terminals 134, 144, 154 may be formed in conventional manner on the substrate surface. The transistor drain and source terminals (e.g., p+ regions) 142 may be formed in the n-well 138 for the isolated PFET 116. This comprises the steps of mask, strip and clean for the ion implant of p+ material just below the surface of the substrate 102 in the desired locations. A number of n+ contact regions are formed just below the surface of the substrate 102. For the isolated NFET 118 located in the p-well 146, these n+ regions 152 comprise the drain and source terminals of the corresponding NFET. Other ones of the n+ regions 128, 150 form contact regions to the corresponding n-wells 122, 124, 148 underneath within the substrate 102. The two layers 130-132 of a dielectric material may be formed, and a number of the contacts (CA) and M1 metal connections 136 may be formed down through the dielectric layers 130-132 to contact the corresponding p+ or n+ contact regions 128, 142, 150, 152 or gates of the isolated NFETs 134, 154 or the isolated PFET 144 when applicable. In addition, typical interconnection structures may be formed above the M1 metal connections 136.

Figure 4:
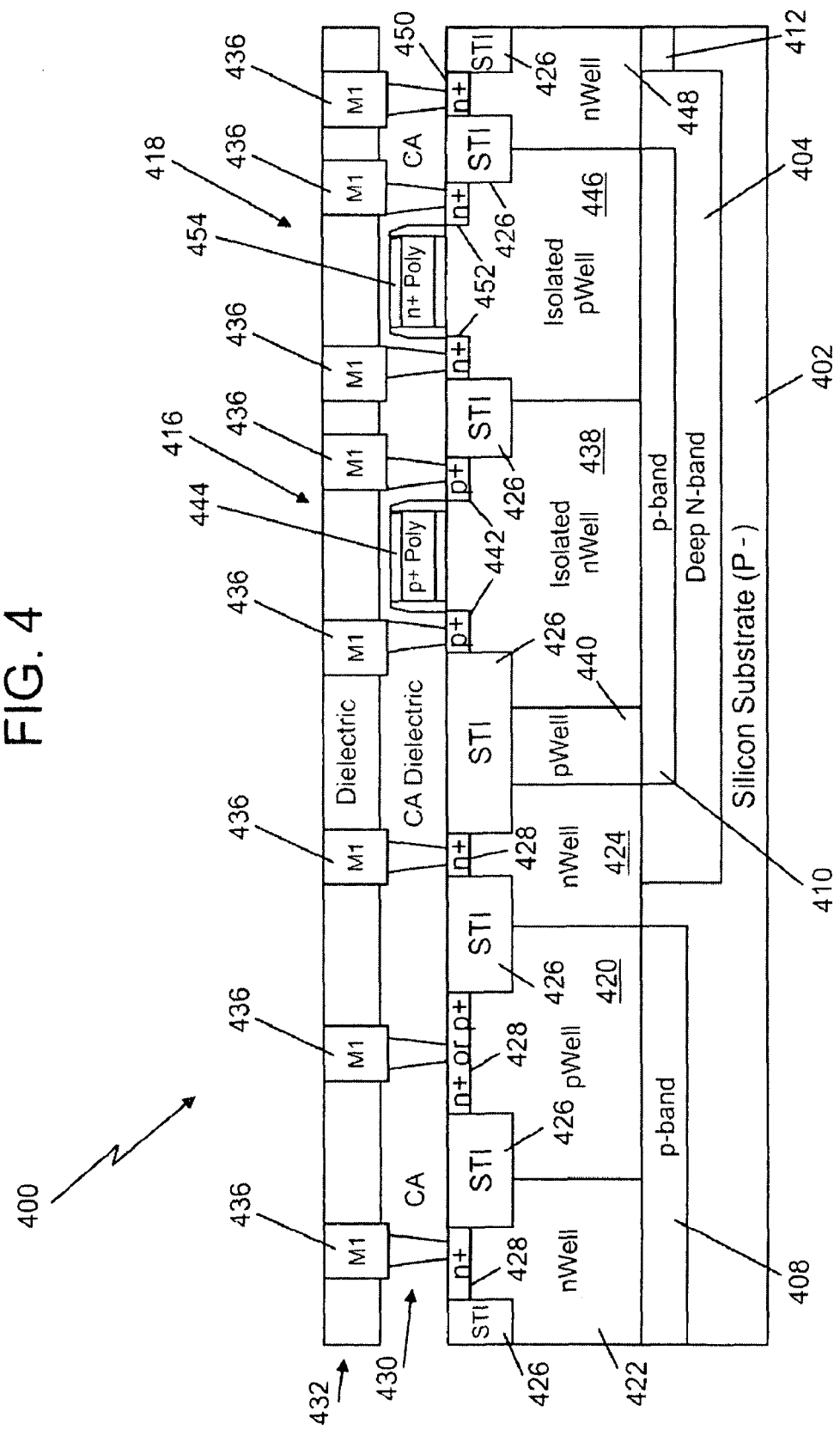
FIG. 4 is a cross-section of another embodiment of the invention relating to a structure of a semiconductor device.
Figure 5:
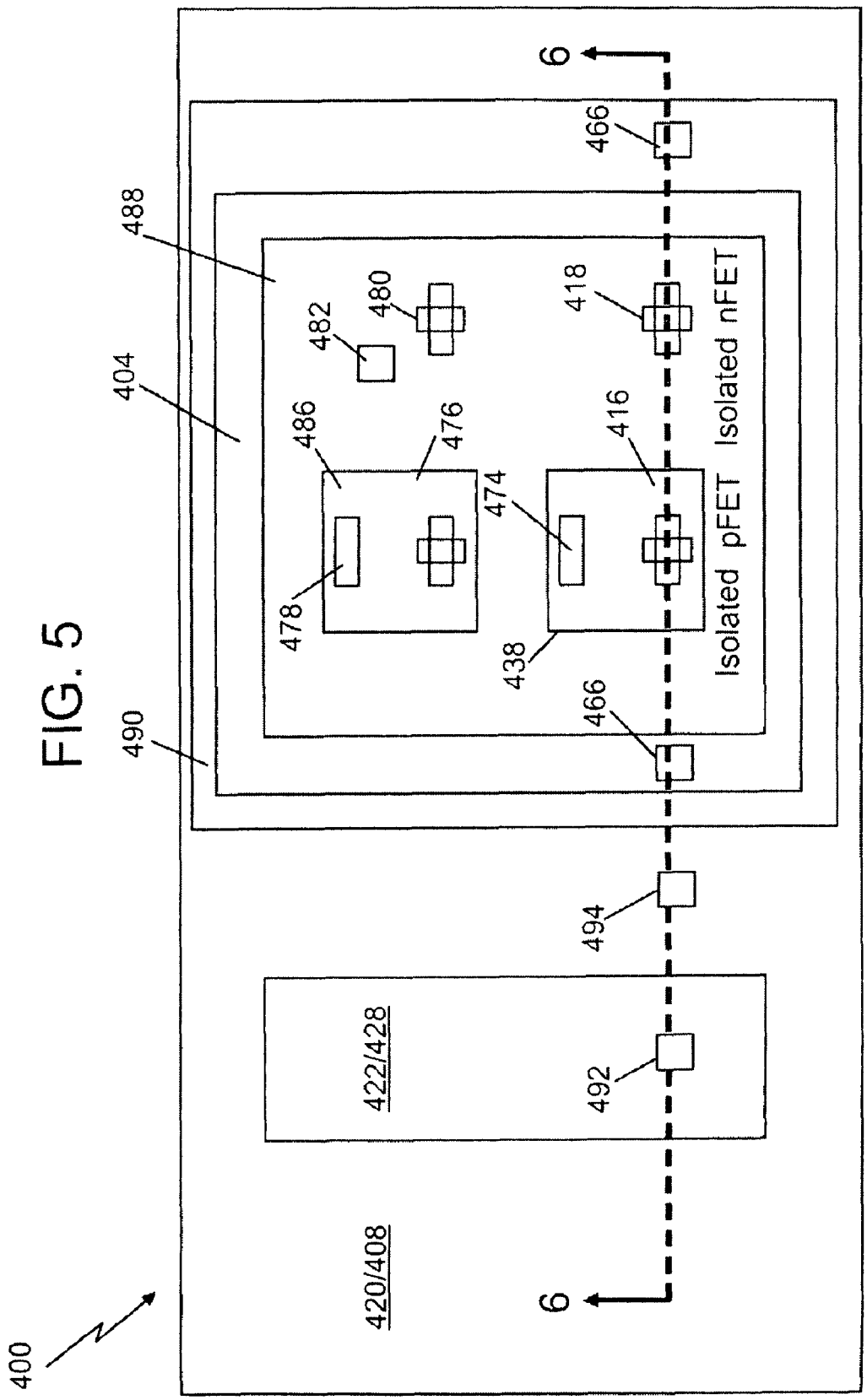
FIG. 5 is a top view of the embodiment of FIG. 4.
Figure 6:
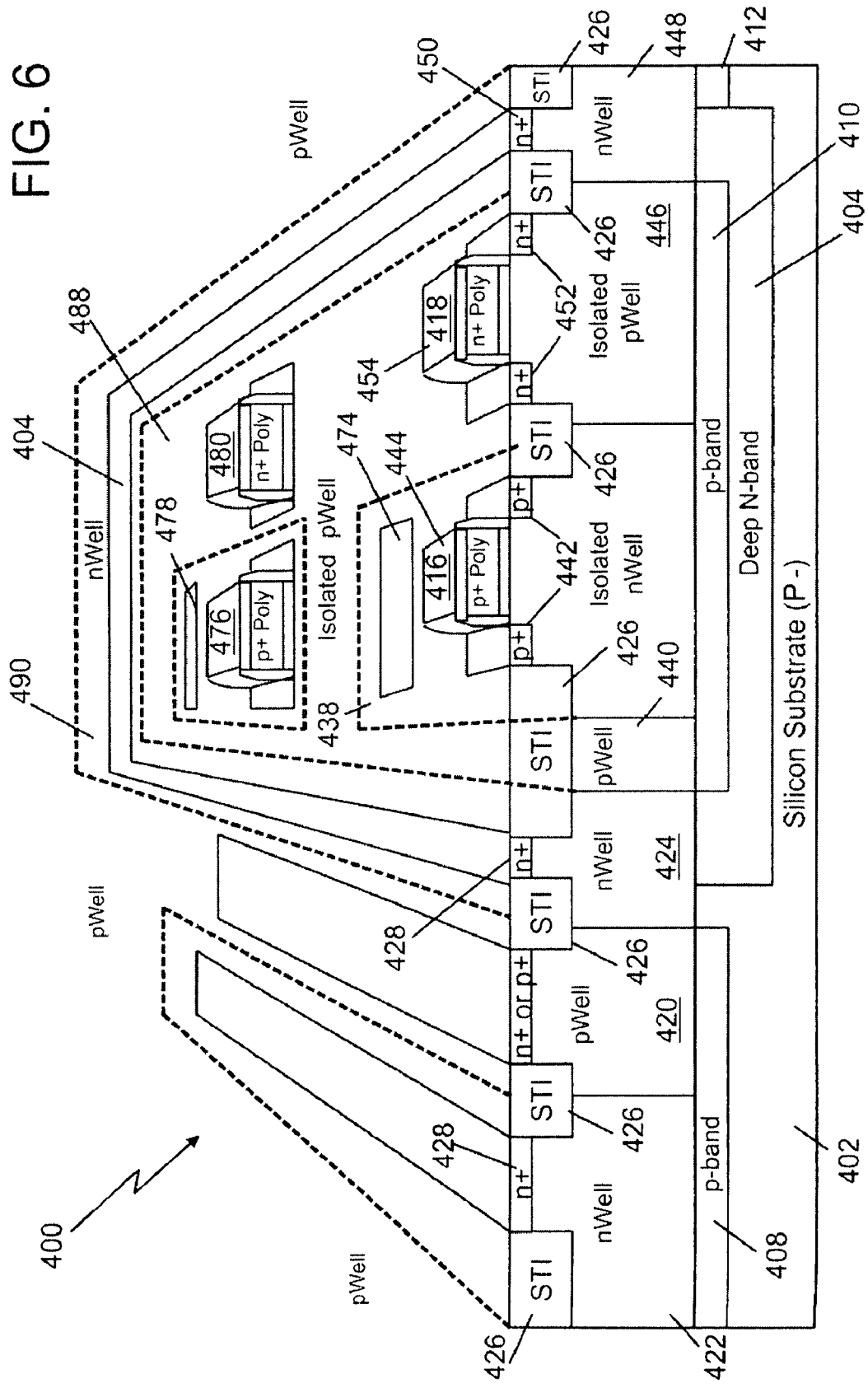
FIG. 6 is a three-dimensional view, taken along the lines 6-6 in FIG. 5, which illustrates in more detail the embodiment of FIGS. 4-5.

Referring to FIGS. 4-6, there illustrated is another embodiment of the invention of a structure 400 to achieve optimized device isolation. The structure 400 is somewhat similar to the structure 100 of FIGS. 1-3. For those physical features or devices in FIGS. 4-6 that are structurally the same or nearly the same as compared to the structure 100 illustrated in FIGS. 1-3 and described hereinabove, the reference numbers used to identify these physical features or devices differ only in the first numeral within the reference number in FIGS. 4-6 being a "4" as opposed to a "1" in FIGS. 1-3.

Figure 7:
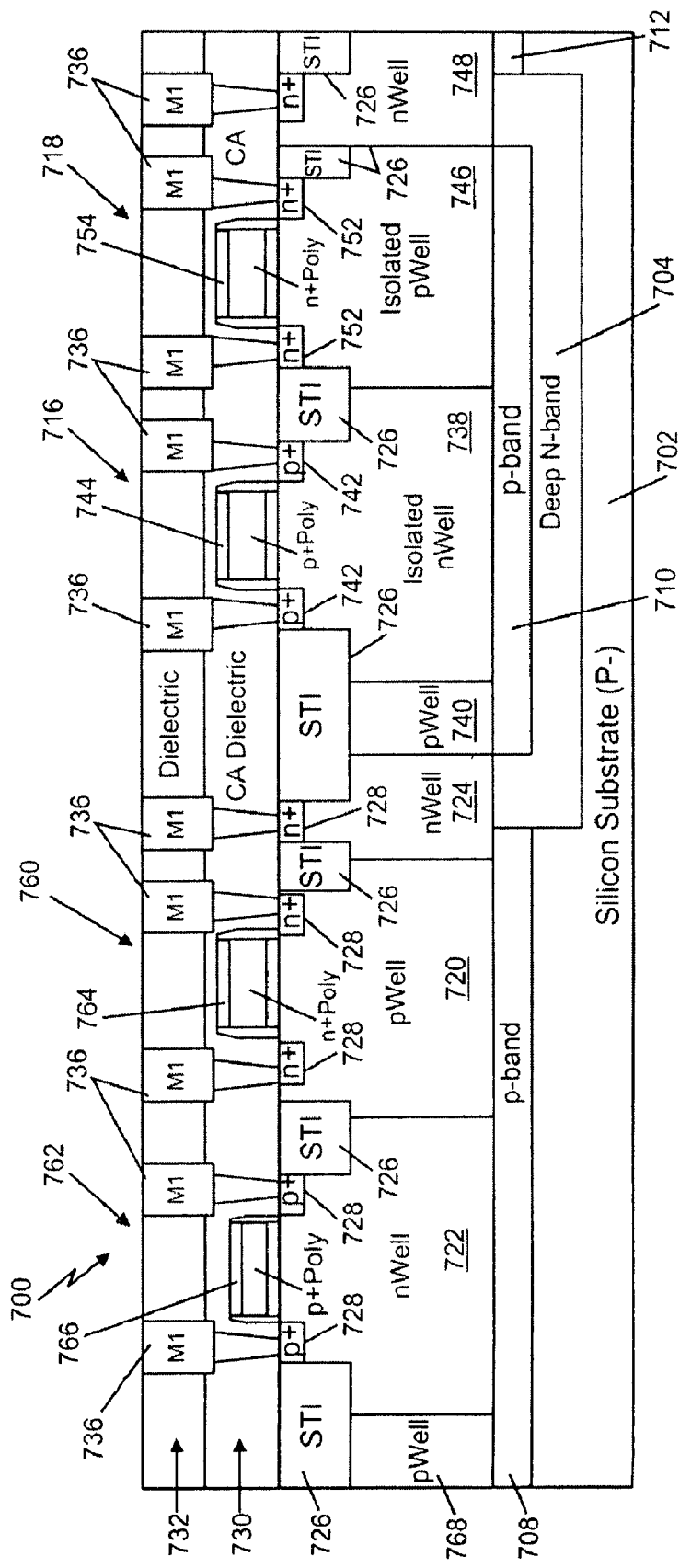
FIG. 7 is a cross-section of yet another embodiment of the invention relating to a structure of a semiconductor device.

A p– silicon substrate 402 is provided and a deep n-band region 404 is disposed above the substrate 402 but does not extend underneath as many of the devices formed in the substrate 402 as in the structure 100 of FIGS. 1-3. The p-well 420 is a standard p-well and the n-well 422 is a standard n-well, as opposed to being either an isolated p-well or an isolated n-well, respectively. A p-band region 408 may be disposed underneath only the p-well 420 and the left side n-well 422. The deep n-band region 404 does not extend beneath the p-band region 408, as shown in FIG. 4. The contact region 428 for the p-well 420 can be doped either n+ or p+. Standard NFET transistors similar to the isolated NFET 454 which are not over a deep n-band region and its n+ source and drain and p+ substrate contacts may exist in the non-isolated p-well 420, as shown in FIG. 7. Also as shown on the left side of FIG. 5, standard PFET transistors, similar to the isolated PFET 444, which are not over a deep n-type region and its p+ source and drain along with the n+ n-well contacts 428 may exist in the non-isolated n-well 422, as shown in FIG. 7. A triple well region is formed by the p-wells 440, 446 and the n-well 438 located between the n-wells 424 and 448, a p-band region 410 located below both of the p-wells 440, 446 and the n-well 438, with the deep n-band region 404 located below all of these regions, resulting in isolated p-wells and isolated n-wells. The isolated PFET 444 and the isolated NFET 454 are similar to those devices 116-118 in FIGS. 1-3, along with the adjacent n-wells 424, 448 and the p-well 440. Thus, the deep n-band region 404 connects electrically to the n-wells 424, 448.

Referring to FIG. 5, the n-well 422 with the p-band region 408 located underneath is shown surrounded by the p-well 420 with the p-band region 408 underneath. An n+ contact or p+ diffusion 492 to the n-well 422 is provided along with a p+ contact or n+ diffusion 494 to the p-substrate 402.

Referring to FIGS. 4-6, the electrical potential of the isolated n-well 438 and that of the isolated n-well 486 can be different or the same. These two n-wells 438, 486 share the common p-band region 410, which is also shared with the isolated p-wells 440, 446. The isolated n-wells 438, 486 are electrically isolated from noise sources in the p– silicon substrate 402, as a result of the p-band region 410 and the deep n-band region 404. Further, the isolated p-wells 440, 446 completely border the isolated n-wells 438, 486. The isolated p-wells 440, 446 within the deep n-band region 404 are fully surrounded by the n-well regions 424, 448, which is indicated in FIG. 6 by the single reference number 490. This n-well region 490 may be at an electrical potential that differs from that of the standard p-well 420 or the isolated p-well region 488. Here, the isolated p-well region 488 and the non-isolated p-well 420, with the p-band region 410 below, are both separated from the deep n-band region 404.

In addition, both the isolated p-well region 488 and the non-isolated p-well 420 have the p-band regions 408-410 disposed under them, but only the isolated p-well region 488 shares a common p-band region 410 with the isolated n-wells 438, 486. The p-band region 408 located under the non-isolated p-well 420 is shared with the non-isolated n-well 422. The non-isolated p-well 420 has its own p-band region 408 located underneath, where the isolated p-wells 440, 446 and the p-band region 410 are separate from the non-isolated p-well 420 are a result of the block resist used in a masking step similar to the masking step described hereinabove with respect to the embodiment of the method used to form the structure 100 of the invention illustrated in FIGS. 1-3. Further, inside the deep n-band region 404, the p-band region 410 is shared, and all of the isolated p-wells 440, 446 may be at the same potential. Also, the n-wells 438, 486 are isolated from either other, which is similar to standard CMOS characteristics outside the deep n-band region 404. The n-wells 424, 448, (the common n-well region 490) and the deep n-band region 404 form a border and are in electrical connection for substrate noise isolation. Also, the common n-well region 490 is at the same electrical potential around the perimeter of the p-well region 488. However, the perimeter n-well region 490 electrical bias can be independent of the electrical bias for the n-wells 438, 486.

Referring to FIG. 7, there illustrated is another embodiment of the invention of a structure 700 to achieve optimized device isolation. The structure 700 is similar to the structure 400 of FIGS. 4-6. For those physical features or devices in FIG. 7 that are structurally the same or nearly the same as compared to the structure 400 illustrated in FIGS. 4-6 and described hereinabove, the reference numbers used to identify these physical features or devices differ only in the first numeral within the reference number in FIG. 7 being a "7" as opposed to a "4" in FIGS. 4-6.

The primary difference between the structure 400 of FIGS. 4-6 and the structure 700 of FIG. 7 is that a standard (i.e., non-isolated) NFET 760 is formed from the non-isolated p-well 720 and a non-isolated PFET 762 is formed from the non-isolated n-well 722. The n+ contacts 728 for the NFET 760 now comprise source and drain terminals. A gate terminal 764 is also provided for the NFET 760. Similarly, the p+ contacts 728 for the PFET 762 now comprise source and drain terminals. A gate terminal 766 is also provided for the PFET 762. A p-well 768 is provided to the left of the non-isolated n-well 722 of the PFET 762. The NFET 760 and the PFET 762 are similar to the isolated NFET 718 and the isolated PFET 716, except that the non-isolated NFET 760 and the non-isolated PFET 762 are not located over the deep n-band region 704.

In the embodiments of the invention, the current present IC design ground rules are contained and there is no increase in the spacing between the NFETs and PFETs formed in the semiconductor device substrate. The embodiments of the invention allow semiconductor circuit designers to place or locate entire digital circuit blocks above a deep n-band isolation region located above the noise generating substrate. This provides for improved noise isolation between digital circuits and sensitive analog and/or radio frequency ("RF") circuits. Also, the embodiments of the invention require no changes to standard FET ground rules within the isolation regions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. For example, if the substrate 102, 402 were n-type, all polarities of well types or implants for the respective bands would reverse.

What is claimed is:

1. A structure, comprising:
   a substrate doped to have a certain type of conductivity;
   a first implant region disposed at least partially next to the substrate, wherein the first implant region is doped to have a type of conductivity opposite to that of the substrate;
   at least one second implant region disposed at least one of within the first implant region and adjacent to the first implant region, wherein the at least one second implant region is doped to have a type of conductivity opposite to that of the first implant region;
   an isolated well region disposed next to at least one of the at least one second implant region, wherein the isolated well region is doped to have the same conductivity as that of the at least one second implant region;
   a pair of well regions disposed on either side of the isolated well region and next to the isolated well region, wherein the pair of well regions are doped to have the same type of conductivity as that of the first implant region, wherein the pair of well regions electrically contact the first implant region, and wherein the isolated well region is not in electrical contact with the first implant region and is isolated therefrom and is isolated from the substrate;
   a third well region doped to have a certain type of conductivity and a fourth well region doped to have a certain type of conductivity; and
   a fifth well region disposed next to the third well region, wherein the fifth well region is doped to have a type of conductivity that is the same as the conductivity of the at least one second implant region and opposite to the type of conductivity of the third well region, and wherein the fifth well region is disposed next to at least one of the at least one second implant region wherein the fifth well region has a built-in potential difference with respect to the first implant region and is isolated therefrom.

2. The structure of claim 1, wherein the isolated well region and the pair of well regions form a portion of an isolated metal oxide semiconductor field effect transistor (MOSFET) device.

3. The structure of claim 1, wherein the substrate is doped to have a p type conductivity, the first implant region is doped to have an n type conductivity, the at least one second implant region is doped to have a p type conductivity, the isolated well region is doped to have a p type conductivity, and the pair of well regions are doped to have an n type conductivity.

4. The structure of claim 1, wherein the third and fourth well regions are disposed next to at least one of the at least one second implant region, and wherein the third and fourth well regions are not in electrical contact with the first implant region and are isolated therefrom and are isolated from the substrate.

5. The structure of claim 1, wherein the third and fourth well regions each form a portion of a corresponding field effect transistor (FET) device.

6. The structure of claim 1, wherein the third well region is doped to have an n type conductivity and the fourth well region is doped to have a p type conductivity, wherein the third well region forms a portion of an PFET device and the fourth well region forms a portion of a NFET device.

7. The structure of claim 1, further comprising a sixth well region disposed next to the fourth well region, wherein the sixth well region is doped to have a type of conductivity that is the same as the conductivity of the first implant region and opposite to the type of conductivity of the fourth well region, and wherein the sixth well region electrically contacts the first implant region.

8. A structure, comprising:
   a substrate doped to have a certain type of conductivity;
   a first implant region disposed at least partially next to the substrate, wherein the first implant region is doped to have a type of conductivity opposite to that of the substrate;
   at least one second implant region disposed at least one of within the first implant region and adjacent to the first implant region, wherein the at least one second implant region is doped to have a type of conductivity opposite to that of the first implant region;
   an isolated well region disposed next to at least one of the at least one second implant region, wherein the isolated well region is doped to have the same conductivity as that of the at least one second implant region;
   a pair of well regions disposed on either side of the isolated well region and next to the isolated well region, wherein the pair of well regions are doped to have the same type of conductivity as that of the first implant region, wherein the isolated well region has a built-in potential difference with respect to the first implant region and is isolated therefrom, wherein one of the pair of well regions is similarly disposed next to at least one of the at least one second implant region, and wherein another one of the pair of well regions electrically contacts the first implant region;
   a third well region doped to have a certain type of conductivity and a fourth well region doped to have a certain type of conductivity; and
   a fifth well region disposed next to the third well region, wherein the fifth well region is doped to have a type of conductivity that is the same as the conductivity of the at least one second implant region and opposite to the type of conductivity of the third well region, and wherein the fifth well region is disposed next to at least one of the at least one second implant region wherein the fifth well region is not in electrical contact with the first implant region and is isolated therefrom.

9. The structure of claim 8, wherein the substrate is doped to have a p type conductivity, the first implant region is doped to have an n type conductivity, the at least one second implant region is doped to have a p type conductivity, the isolated well region is doped to have a p type conductivity, and the pair of well regions are doped to have an n type conductivity.

10. The structure of claim 8, wherein the isolated well region and the pair of well regions form a portion of a triple well technology device.

11. The structure of claim 8, wherein the third and fourth well regions are disposed next to at least one of the at least one second implant region, and wherein the third and fourth well regions are not in electrical contact with the first implant region and are isolated therefrom.

12. The structure of claim 8, wherein the third and fourth well regions each form a portion of a corresponding field effect transistor (FET) device.

13. The structure of claim 8, wherein the third well region is doped to have an n type conductivity and the fourth well region is doped to have a p type conductivity, wherein the third well region forms a portion of an PFET device and the fourth well region forms a portion of a NFET device.

14. The structure of claim 8, further comprising a sixth well region disposed next to the fourth well region, wherein the sixth well region is doped to have a type of conductivity that is the same as the conductivity of the first implant region and opposite to the type of conductivity of the fourth well region, and wherein the sixth well region electrically contacts the first implant region.

15. A structure, comprising:
- a p– doped substrate;
- a first implant region disposed within the substrate, wherein the first implant region is doped n–;
- a plurality of second implant regions disposed at least one of within the first implant region and adjacent to the first implant region, wherein the second implant regions are doped p–;
- an isolated p well region disposed next to one of the plurality of second implant regions;
- a pair of n well regions disposed on either side of the isolated p well region, wherein the pair of well regions electrically contact the first implant region, and wherein the isolated p well region is not in electrical contact with the first implant region and is isolated therefrom;
- an isolated n well region and a second isolated p well region both disposed next to at least one of the plurality of second implant regions, wherein the isolated n well region and the second isolated p well region are not in electrical contact with the first implant region and are isolated therefrom, wherein the isolated n well region forms a portion of an PFET device and wherein the second isolated p well region forms a portion of a NFET device; and
- a third isolated p well region disposed next to the isolated n well region, wherein the third isolated p well region is disposed next to at least one of the plurality of second implant regions, wherein the third isolated p well region has a built-in potential difference with respect to the first implant region and is isolated therefrom.

16. The structure of claim 15, wherein the isolated p well region and the pair of n well regions form a portion of an isolated metal oxide semiconductor field effect transistor (MOSFET) device.

17. The structure of claim 15, further comprising a third n well region disposed next to the second isolated p well region, wherein the third n well region electrically contacts the first implant region.

18. A structure, comprising:
- a p– doped substrate;
- a first implant region disposed within the substrate, where the first implant region is doped n–;
- a plurality of second implant regions disposed at least one of within the first implant region and adjacent to the first implant region, wherein the plurality of second implant regions are doped p–;
- an isolated p well region disposed next to one of the plurality of second implant regions;
- a pair of n well regions disposed on either side of the isolated p well region, wherein the isolated p well region is not in electrical contact with the first implant region and is isolated therefrom, wherein one of the pair of n well regions is disposed next to one of the second implant regions and is not in electrical contact with the first implant region and is isolated therefrom, and wherein another one of the pair of n well regions electrically contacts the first implant region;
- an isolated n well region and a second isolated p well region both disposed next to at least one of the plurality of second implant regions, wherein the isolated n well region and the second isolated p well region are not in electrical contact with the first implant region and are isolated therefrom, wherein the isolated n well region forms a portion of an PFET device and wherein the second isolated p well region forms a portion of a NFET device; and
- a third isolated p well region disposed next to the isolated n well region, wherein the third isolated p well region is disposed next to at least one of the plurality of second implant regions, wherein the third isolated p well region is not in electrical contact with the first implant region and is isolated therefrom.

19. The structure of claim 18, further comprising a third n well region disposed next to the second isolated p well region, wherein the third n well region has a built-in potential difference with respect to the first implant region.

* * * * *